CRYOGENIC D.C. TO A.C. AMPLIFIER

Filed April 11, 1960 2 Sheets-Sheet 1

Inventor:
Theodor A. Buchhold,
by Charles W. Helzer
His Attorney.

CRYOGENIC D.C. TO A.C. AMPLIFIER

Filed April 11, 1960 2 Sheets-Sheet 2

Inventor:
Theodor A. Buchhold,
by Charles W. Helzer
His Attorney.

United States Patent Office 3,098,189

Patented July 16, 1963

3,098,189
CRYOGENIC D.C. TO A.C. AMPLIFIER

Theodor A. Buchhold, Schenectady, N.Y., assignor to General Electric Company, a corporation of New York Filed Apr. 11, 1960, Ser. No. 21,515
7 Claims. (Cl. 321—8)

The present invention relates to a new and improved direct current amplifier.

More particularly, the invention relates to a new and improved direct current amplifier employing superconductive parts which has zero drift, and is essentially noise free.

In order to measure low amplitude direct current electric signals such as are produced by a thermocouple or other similar device, it has heretofore been necessary to employ extremely sensitive and expensive amplifiers in advance of the measurement equipment to first amplify the signal to measurable levels. In doing this it is of course essential that the amplifier inject no noise into the signal such as is created by thermionic action and so forth, otherwise the two become indistinguishable. Because of this limitation, there are certain types of signals having extremely low amplitude levels which existing amplifiers are incapable of amplifying without drowning out the signal with noise generated in the amplifier itself. Additionally, the environmental conditions under which amplifiers of this type are often used are such that it is impossible to continually or even periodically adjust the amplifier to correct the drift. Under such conditions it is of course desirable that the amplifier used with the measuring equipment be as free from drift as possible.

It is therefore a primary object of the present invention to provide a new and improved direct current amplifier for amplifying low level signals without introducing any extraneous background noise into the signal and therefore is essentially noise free, and which possesses zero drift characteristics.

In practicing the invention a noise free zero drift direct current amplifier is provided which converts direct current signals to alternating current signals. The amplifier is comprised by first and second sets of coils which are inductively coupled and which may be formed from superconductive wire. The amplifier further includes a movable member fabricated, at least in part, of superconductive material which is in position adjacent the first and second coils, and which is moved continuously to vary the inductive relation between the coils. A direct current input signal to be amplified is applied to the input of one of the coils, while the amplified alternating current output signal is derived from the remaining coil.

Other objects, features and many of the attendant advantages of this invention will be appreciated more readily as the same becomes better understood by reference to the following detailed description, when considered in connection with the accompanying drawings wherein like parts in each of the several figures are identified by the same reference character, and wherein.

Figure 1:
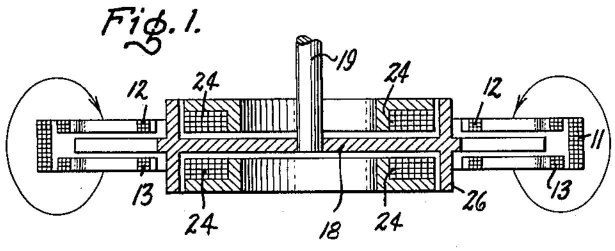
FIGURE 1 is a sectional side view of a new and improved superconductive amplifier constructed in accordance with the invention.
Figure 2:
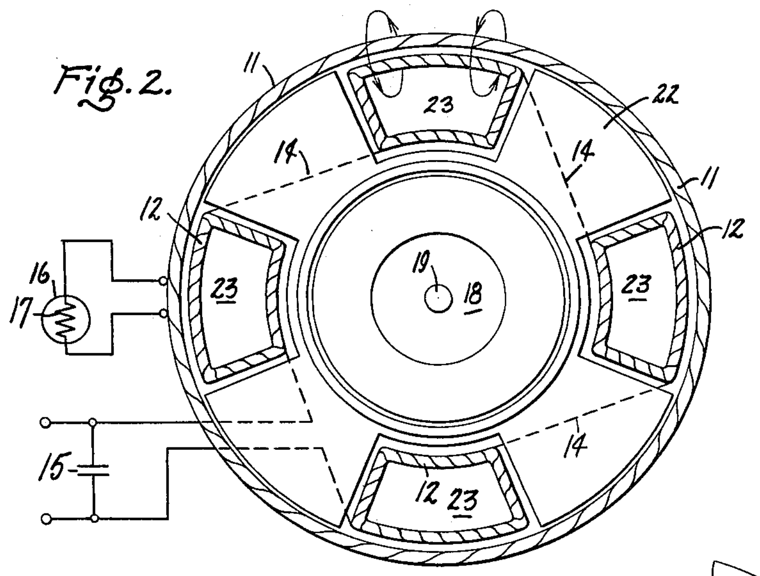
FIGURE 2 is a plan view of the amplifier shown in FIGURE 1.

The amplifier shown in FIGURES 1 and 2 of the drawings comprise an outer large diameter control winding 11 formed of many turns of superconducting wire. The amplifier of FIGURES 1 and 2 is adapted to be disposed within a cold space which will serve to maintain the temperature of the parts of the amplifier at a value such that its parts become superconductive (e.g., 4.2° Kelvin). Since such equipment is already well known in the art, and has been described in a number of places (see, for example, copending U.S. application Serial No. 791,953, "Insulated Housing," filed February 9, 1959, T. A. Buchhold and K. F. Schoch, inventors, assigned to the General Electric Company) a further description of this equipment is believed unnecessary. The outer coil 11 surrounds a plurality of individual multiple turn output windings 12 and 13 which are arranged around the inner periphery of the control winding 11 in the manner best shown in FIGURE 2 of the drawings. The output windings 13 and 12 are inductively coupled with each other and with the control winding 11 and are electrically interconnected through appropriate connections shown by dotted lines 14 in FIGURE 2 of the drawings. These connections serve to connect all of the output windings 12 and 13 in series circuit relationship with a capacitor 15 which is of a value to tune the circuit to series resonance at the operating frequency of the amplifier. The amplified alternating current output signal may then be obtained across the capacitor 15. A source of input signals to be amplified is shown at 16 together with its internal resistance 17 and may comprise a thermocouple or other source of low amplitude direct current potential which changes in magnitude at very slow rates. This essentially direct current input signal is supplied to the control winding 11, and the magnetic flux produced by the winding 11 as a result of the input signal will normally link with the multiple turn output windings 12 and 13 where such intercoupling is not interrupted by a superconductive disc 18 supported between the two sets of windings 12 and 13. The disc 18 constitutes a rotatable superconductive member which is rotated by a drive motor (not shown) or other suitable drive means connected through a shaft 19 to a superconductive hub portion. The hub portion of disc 18 terminates in outer fan-like superconductive portions 22 which are interspaced with alternate open areas indicated at 23. The superconductive rotatable disc 18 is supported within a suitable housing for the amplifier (not shown) by means of a plurality of magnetic bearing coils 24 which preferably are formed from a plurality of turns of superconductive wire, and are energized from a suitable direct current source, not shown. A flange portion 26 is provided on the superconductive disc 18 against which the magnetic bearing coils act to support disc 18 in the dimension transverse to the axis of shaft 19. The flange portion 26 together with the superconductive hub portion of the vane serves also to confine the magnetic bearing flux produced by the bearing coils to the interior hub portion of the rotatable disc so that the bearing flux does not interfere with signal coils of the amplifier.

In operation, the superconductive amplifier is first reduced in temperature to its operating range in the neighborhood of 4.2 Kelvin, and the rotatable disc 18 is caused to be rotated by the drive motor coupled to the shaft 19 at a constant speed. The direct current signal to be amplified is then applied to the input terminal 16 and induces a flux in the control winding 11 which links with the multiple turn coils 12 and 13 of output windings only through those open areas indicated at 23 that occur in the vane 18. Where superconductive areas indicated at 2 exist, they will block the lines of flux so that the magnetic lines of flux are interrupted, and no linkage takes place between the control winding 11 and the output windings 12 and 13. Because the superconductive disc 18 is rotated it can be appreciated that the linkage of the lines of flux is alternately interrupted and re-established thereby inducing an A.C. voltage in the output windings 12 and 13 which is proportional in value to the direct current signal supplied to the input terminal 16. Because the output windings 12 and 13 are tuned to series resonance by capacitor 15, maximum output power will be obtained from the amplifier. This alternating current output potential may then be further amplified by conventional alternating current amplifiers. Also, because disc 18, the control winding 11, and the output windings 12 and 13 are always superconductive, it can be appreciated that there is substantially little or no noise generated in these windings due to thermal action.

Further, if the input signal to the amplifier drops to zero the magnetic flux produced by control winding 11 becomes zero so that the output potential from the amplifier drops to zero. Therefore it can be appreciated that the amplifier has no zero drift.

Figure 3:
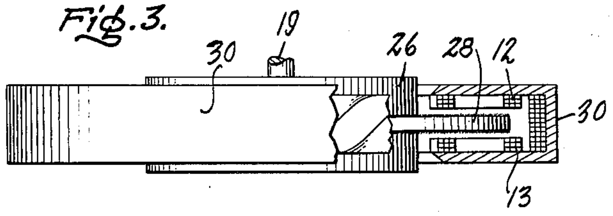
FIGURE 3 is a partial sectional side view of an alternative form of the amplifier shown in FIGURE 1.
Figure 4:
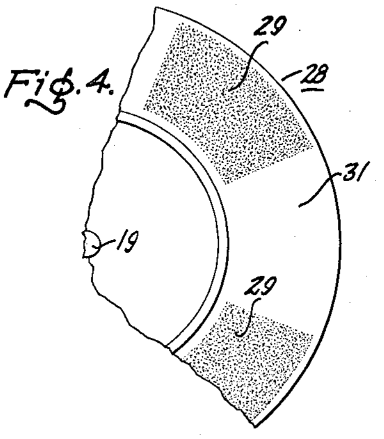
FIGURE 4 is a partial plan view of a disc having alternate magnetically permeable areas and superconductive areas, and which comprises a part of the amplifier shown in FIGURE 3.
Figure 5:
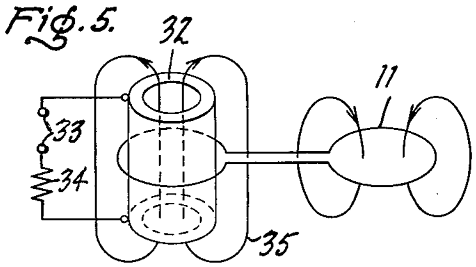
FIGURE 5 is a schematic functional diagram of a superconductive direct current transformer that can be employed with the amplifiers shown in FIGURES 1 and 3 to develop a large current signal for application to the amplifiers.

A second embodiment of a superconductive amplifier employing the principles of the invention is shown in FIGURES 3 and 4 of the drawings. The superconductive amplifier of FIGURES 3 and 4 is constructed and operates in a similar manner to that shown in FIGURES 1 and 2, and for that reason includes an outer control winding 11 which is inductively coupled with a set of inner multiple turns output windings 12 and 13 that are connected in series circuit relationship to a suitable output circuit, not shown. The inductive relation between the outer coil 11 and the inner coils 12 and 13 is interrupted by a magnetically permeable steel disc 28. Disc 28 is rotatably supported between the multiple turn secondary windings 12 and 13 by suitable bearing coils (not shown) acting against the hub of the disc and isolated from signal circuit by flange portion 26. The rotatable disc 28 is best illustrated in FIGURE 4 of the drawings wherein it can be seen that the outer periphery of the disc has alternate fan-like portions 29 which are rendered superconductive by the adherence of a suitable superconductive material to these portions with the remaining alternate fan-like portions 31 being magnetically permeable. By constructing the superconductive vane 28 in this manner, due to the iron, the magnetic resistance between the output coils is reduced and a higher flux density is obtained with a consequent improvement in amplification. Additional increase in the flux linking the output windings 12 and 13 is obtained by the provision of a toroidal-shaped iron core 30 which extends between the control winding 11 and the output windings 12 and 13 around the entire periphery of the windings. In operation, the embodiment of the invention shown in FIGURES 3 and 4 functions in precisely the same manner as that described with relation to FIGURES 1 and 2, to develop an amplified alternating current output signal across its output terminals. When used in amplifying signals of very small currents, it may be desirable or necessary that the signal current be transformed to a larger value in advance of being supplied to the control winding of an amplifier such as shown in FIGURES 1 and 3, modified to the extent that the control winding 11 is formed of a single turn superconductive coil. For this purpose it may be possible to employ a D.C. transformer such as is illustrated schematically in FIGURE 5 of the drawings. This transformer includes a multiple turn primary winding 32 which is fabricated from a large number of turns of superconductive wire, and is excited from a low voltage direct current signal source 33 having an internal resistance 34. The multiple turn primary winding 32 is inductively coupled to a single turn secondary winding 35 that in turn is connected to a single turn superconductive control winding 11 that replaces the multiple turn control windings 11 of the amplifiers shown in FIGURES 1 and 3. By this arrangement, a low value input current will produce a relatively large flux in the primary winding 32 which in turn will result in developing a large signal current in the single turn secondary winding 35. This transformed signal current can then be used to excite the single turn primary winding 11 of the amplifiers of FIGURES 1 and 2.

Figure 6:
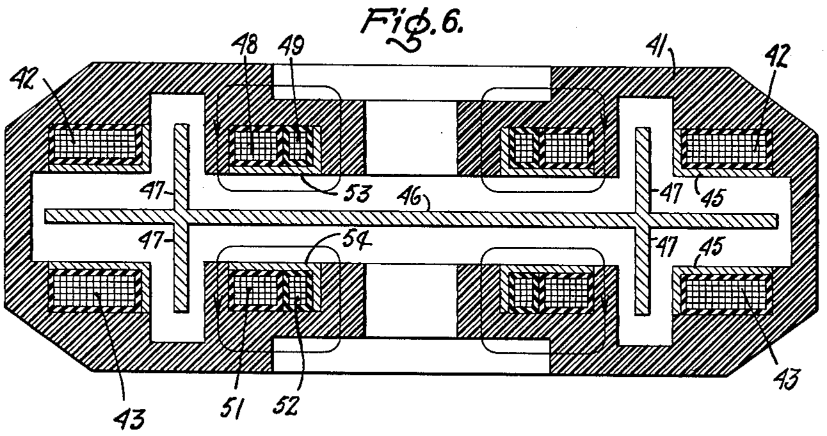
FIGURE 6 is a cross-sectional view of still a third form of superconductive amplifier constructed in accordance with the invention.

A second form of superconductive amplifier constructed in accordance with the invention is shown in FIGURE 6 of the drawings. The amplifier shown in FIGURE 6 comprises an outer housing 41 fabricated from insulating material or other suitable material which has no, or very small, magnetic losses, and having a number of receptacles formed therein for receiving magnetic field producing driving coils 42 and 43 to be described hereinafter. The magnetic driving coils 42 and 43 are disposed within housing 41, and are generally toroidal in shape so that they extend completely around the periphery of the housing 41. The driving coils 42 and 43 have superconductive plates 44 and 45 which are disposed over their opposing faces for field guiding purposes, and which have a small slit or gap in their cross section so as to prevent the development of short circuit currents around their periphery. The superconductive plates 44 and 45 define a space intermediate the magnetic driving coils 42 and 43 in which a vibratable superconductive disc 46 is disposed. The superconductive disc 46 extends over almost the entire cross sectional area of the interior of the amplifier housing 41, and includes a pair of upright shielding portions 47 which are acted upon by the driving coil magnetic flux to provide lateral stability, and which further serve to shield the interior of the housing from the fields of the driving coils 42 and 43. In this manner the magnetic fields produced by the driving coils 42 and 43 are isolated from the interior of the amplifier housing, and therefore prevented from interfering with the signal amplifying circuits of the amplifier. Disposed within the interior of the housing 41 is a second set of magnetic signal amplifying coils 48, 49 and 51, 52. There are fewer turns in coils 49 and 52 than in their related coils 48 and 51, respectively, so that in effect each set comprises a step-up transformer. One set of signal amplifying coils 48 and 49 are disposed over the vibratable superconductive disc 46 and a second set of coils 51 and 52 are positioned under disc 46. The opposing faces of the signal coils 48 and 49, and 51, 52 respectively, are covered by annular superconductive shields 53 and 54 which have a slit or gap across their entire cross section to prevent the development of undesired circulating currents and which are provided for field forming purposes. By this arrangement, the superconductive disc 46 may be vibrated up and down in the plane of the drawings by the driving coils 42 and 43 in the manner to be described hereinafter. This results in modifying the coupling between the two sets of control and output windings 48 and 49, and 51 and 52, respectively, in a manner such as to decrease the magnetic flux threading a set of windings when the disc 46 approaches the respective set, and to increase the magnetic flux threading the respective set of windings when the disc departs from the set. Accordingly, vibration of the superconductive disc 46 functions to generate an alternating current component in the output windings 49 and 52, respectively, which will have a frequency similar to that of the frequency of vibration of superconductive disc 46.

Figure 7:
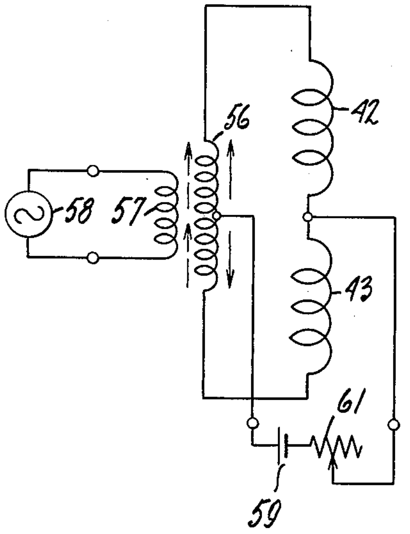
FIGURE 7 is a schematic circuit diagram of a driving circuit for energizing the driving coils comprising a part of the amplifier shown in FIGURE 6.
Figure 8:
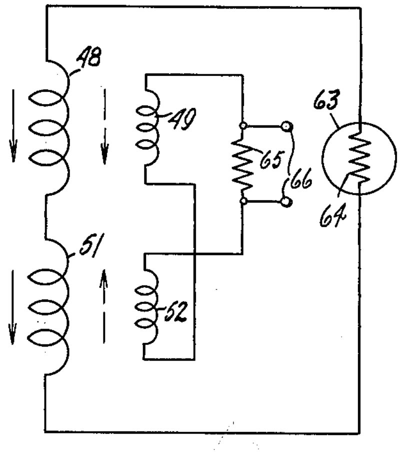
FIGURE 8 is a schematic circuit diagram of the signal input and output circuits comprising part of the amplifier shown in FIGURE 6.

The driving and signal circuits for the superconductive amplifier of FIGURE 6 are shown in FIGURES 7 and 8 of the drawings. FIGURE 7 illustrates the driving circuit for the magnetic driving coils 42 and 43 which are shown connected in series circuit relationship across a secondary winding 56 of a supply transformer. The primary winding 57 of the transformer is connected across a source 58 of vibrating signals having a frequency the same as that at which it is desired to vibrate the superconductive disc 46. The center tap of the secondary winding 56 and the juncture of the magnetic bearing coils 42 and 43 are connected together through a direct current biasing circuit formed by a battery 59 and variable resistor 61. This direct current biasing source functions to establish a reference magnetizing current through the magnetic driving coils 42 and 43, each of which coils has an appropriate number of turns for positioning the superconductive disc 46 approximately midway in the space between the two driving coils 42 and 43. Thereafter, the alternating current vibrating signal supplied from source 58 which is superimposed on the direct biasing current from source 59 will vary the composite signal level through the driving coils 42 and 43 in a manner such as to cause the superconductive disc 46 to be vibrated up and down at a frequency determined by the frequency of the source 58.

The signal circuits for exciting the control windings 48 and 51 are shown in FIGURE 8 of the drawings. The control windings 48 and 51 are connected in series circuit relationship with a source of direct current electric signals 63 having an internal resistance 64, and which might comprise a thermocouple or similar sensing device. The direct current signal currents produced by the signal source 63 will flow in the control windings 48 and 51 to produce a flux that links with the output windings 49 and 52. The signal output windings 49 and 52 are likewise connected in series circuit relationship, however, it should be noted that connections to the input and output terminals of the winding 52 are reversed with respect to the output winding 49 so that even though signal currents induced in this coil are in the reverse direction from those induced in the signal output winding 49, the interconnection of the coils is such that the currents will be cumulative or additive as explained more fully hereinafter. The resultant amplified output signal is supplied to an output load resistor 65 to develop an output potential that is available across the output terminals 66.

In operation, assuming the parts of the amplifier to be at superconducting temperature, the direct current bias supplied to the magnetic bearing coils 42, 43 is adjusted to properly suspend the superconductive disc 46 approximately midway in the space between the signal coils 48, 49 and 51, 52. Thereafter, the vibrating or oscillating signals 58 are supplied to the magnetic bearing coils 42, 43 so that the superconductive disc 46 is caused to oscillate up and down at a frequency determined by the frequency of the source 58. With the amplifier in this condition, application of an input signal to be amplified to the control windings from source 63 induces a current flow through these windings and establishes a magnetic field that links with the output windings 49 and 52. The inductive couplings between these respective pairs of windings will be modified by the vibrating superconductive disc 46 which will cause a decrease in the flux linking a respective set of windings as the disc 46 approaches the windings, and will cause an increase in the flux linking the windings as the disc departs from the respective set of windings. This will have the effect of an increasing or collapsing magnetic field on the windings, and will induce electric voltages in each of them. With respect to the control windings 48 and 51, one winding will be subjected to an increasing flux and the other to a decreasing flux so that voltages of equal magnitude but opposite direction will be induced in these windings which will cancel out. With regard to the output windings 49 and 52, however, these windings are connected in reverse relations so that the two induced voltages become additive and the induced voltages will be added across the load resistor to produce an output signal voltage proportional to the D.C. control current supplied from source 63 and having an alternating current carrier frequency of the vibrating superconductive disc 46. It can be appreciated therefore, that the device operates as a direct current to alternating current amplifier for low level signals.

From a consideration of the above description, it can be appreciated that because the signal coils 48, 49, and 51, 52, and the disc 46 are fabricated from superconductive material maintained at an operating temperature in the neighborhood of 4.2 Kelvin, extraneous noise will not be introduced into the signal due to thermal action and the like, and accordingly the amplifier will be substantially noise free. Also since there will be no signal current induced in the primary windings 48 and 51 of the amplifier except when a signal is present from the source 63 when this signal drops to zero, similarly the current induced in the secondary windings 49 and 52 will drop to zero, and there will be no drift of the amplifier from its preadjusted zero reference level.

From the foregoing description, it can be appreciated therefore, that the invention provides a new and improved superconductive amplifier for amplifying low level signals without introducing any extraneous background noise into the signal. Hence, the amplifier is essentially noise free. Further, from a consideration of the nature of the operation of the amplifier it can be appreciated that the amplifier possesses no zero drift characteristics since no signal output occurs until a signal is applied to the input which rises above zero level.

Having described several embodiments of the new and improved amplifier constructed in accordance with the invention, it is believed obvious that other modifications and variations of the present invention are possible in the light of the above teachings. It is therefore to be understood that changes may be made in the particular embodiments of the invention described which are within the full intended scope of the invention as defined by the appended claims.

What I claim as new and desire to secure by Letters Patent of the United States is:

1. A noise-free zero drift amplifier including in combination first and second inductively coupled windings fabricated from superconducting materials, a movable member fabricated at least in part of superconductive materials in juxtaposition to said first and second windings for influencing the inductive relation between the windings, means for moving said movable member at a predetermined rate to thereby vary the inductive relation between the coils, means for impressing an input signal to be amplified on said first winding, and means for deriving an amplified alternating current replica of said input signal from said second winding.

2. A noise-free zero drift amplifier including in combination a first magnetic field producing control winding fabricated of superconducting material, a second output winding fabricated from superconducting materials juxtaposed to said control winding in inductive relationship, a movable member positioned to intercept the magnetic lines of flux inductively coupling said first and second windings and having alternate superconductive and magnetically permeable areas for interrupting the inductive relationship between said first and second windings, means for moving said movable member at a predetermined rate to thereby vary the inductive relation between the windings, means for impressing an input signal to be amplified upon said first winding, and means for deriving an amplified replica of said input signal from said second winding.

3. A noise-free zero drift amplifier including in combination a first magnetic field producing control winding fabricated of superconducting material, a second output winding fabricated from superconducting materials juxtaposed to said first coil in inductive relationship, a rotatable disc positioned to intercept the magnetic lines of flux inductively coupling said first and second windings and having alternate superconductive and open areas for interrupting the inductive relationship between said first and second coils, means for impressing an input signal to be amplified upon said control winding, and means for deriving an amplified replica of said input signal from said output winding.

4. A noise-free zero drift amplifier including in combination a first magnetic field producing control winding fabricated of superconducting material, a set of multiple turn output windings fabricated from superconducting materials juxtaposed to said first coil in inductive relationship and connected in series circuit relationship, a rotatable disc positioned to intercept the magnetic lines of flux inductively coupling said control and output windings and having alternate superconductive and open areas for interrupting the inductive relationship between said control and output windings, a set of bearing coils for magnetically supporting said disc in said relationship, means for isolating said bearing coils from said control and output windings, means for rotating said rotatable disc, means for impressing an input signal to be amplified upon said control winding, and means for deriving an amplified replica of said input signal from said output winding.

5. A noise-free zero drift amplifier including in combination a first large diameter magnetic field producing control winding fabricated of superconducting material, a set of multiple turn output windings fabricated from superconducting materials disposed within said control windings in inductive relationship and connected in series circuit relationship, a core member having low magnetic reluctance intercoupling said control and output windings, a rotatable disc positioned to intercept the magnetic lines of flux inductively coupling said control and output windings and having alternate superconductive and magnetically permeable areas for interrupting the inductive relationship between said control and output windings, a set of bearing coils for magnetically supporting said disc in said relationship, means for isolating said bearing coils from said control and output windings, means for rotating said disc at a substantially constant rate, means for impressing an input signal to be amplified upon said control winding, and means for deriving an amplified replica of said input signal from said second set of coils.

6. A noise-free zero drift amplifier including in combination a housing, a first set of magnetic field producing coils fabricated from superconducting materials positioned in said housing, a vibratable superconducting member disposed in said housing and adapted to be vibrated within the housing by said first set of magnetic field producing coils, and a second set of inductively coupled signal windings having different numbers of turns fabricated from superconducting materials and disposed within said housing in juxtaposition to said vibratable member, said superconductive vibratable member being adapted to modify the inductive relation between the second set of windings, means for impressing a signal to be amplified on the one of said signal windings having the fewer turns, and means for deriving an amplified replica of the input signal form the remaining one of said signal windings having the larger number of turns.

7. A noise-free zero drift amplifier including in combination a housing, a vibratable superconducting disc disposed in said housing, a first set of superconducting coils disposed on opposite sides of the disc and acting against the ends thereof to cause the disc to be vibrated within the housing, a respective second set of inductively coupled signals windings having different numbers of turns fabricated from superconductive material disposed in said housing on respective sides of said disc, said vibratable superconductive disc being adapted to modify the inductive relation between each of the windings in each set, means for isolating the magnetic flux produced by said first set of coils from influencing said signal windings, means for applying an input signal to be amplified to the one of said signal windings having fewer turns, and means for deriving an amplified replica of said input signal from the remaining one of said signal windings having the larger number of turns.

References Cited in the file of this patent

UNITED STATES PATENTS

| | | |
|---|---|---|
| 2,689,332 | Greene | Sept. 14, 1954 |
| 2,704,431 | Steele | Mar. 22, 1955 |
| 2,725,474 | Fricsson et al. | Nov. 29, 1955 |
| 2,820,915 | Mathews | Jan. 21, 1958 |

FOREIGN PATENTS

| | | |
|---|---|---|
| 25,457 | France | Mar. 17, 1923 |